(12) United States Patent
Harada

(10) Patent No.: US 10,680,641 B2
(45) Date of Patent: Jun. 9, 2020

(54) DECODER CIRCUIT AND DECODER CIRCUIT DESIGN METHOD

(71) Applicant: MegaChips Corporation, Osaka (JP)

(72) Inventor: Shingo Harada, Chiba (JP)

(73) Assignee: MegaChips Corporation, Osaka (JP)

(*) Notice: Subject to any disclaimer, the term of this patent is extended or adjusted under 35 U.S.C. 154(b) by 0 days.

(21) Appl. No.: 16/538,890

(22) Filed: Aug. 13, 2019

(65) Prior Publication Data

US 2020/0067522 A1 Feb. 27, 2020

(30) Foreign Application Priority Data

Aug. 21, 2018 (JP) .................................. 2018-154599

(51) Int. Cl.
H03M 7/16 (2006.01)
H03M 1/66 (2006.01)

(52) U.S. Cl.
CPC .............. *H03M 7/165* (2013.01); *H03M 1/66* (2013.01)

(58) Field of Classification Search
CPC .... H03M 1/687; H03M 1/745; H03M 1/1009; H03M 1/002; H03M 1/747; H03M 7/165
USPC ...................... 341/50–90, 144, 145, 154, 153
See application file for complete search history.

(56) References Cited

U.S. PATENT DOCUMENTS

| | | | | |
|---|---|---|---|---|
| 5,243,347 A * | 9/1993 | Jackson | ................. | H03M 1/682 341/144 |
| 5,283,580 A * | 2/1994 | Brooks | ................. | H03M 1/682 341/145 |
| 5,532,620 A | 7/1996 | Seo et al. | | |
| 5,640,162 A * | 6/1997 | Lewyn | ................... | H03M 1/687 341/144 |
| 6,456,218 B1 * | 9/2002 | Dedic | ................. | H03M 1/0673 341/144 |
| 6,703,956 B1 * | 3/2004 | Mueller | ................ | H03M 1/682 341/136 |
| 9,356,614 B1 * | 5/2016 | Amelifard | ........... | H03M 7/6047 |
| 2002/0084925 A1 * | 7/2002 | Dedic | ................. | H03M 1/0673 341/153 |
| 2003/0001639 A1 | 1/2003 | Kim et al. | | |
| 2003/0201924 A1 * | 10/2003 | Lakshmikumar | ..... | H03M 1/687 341/153 |
| 2006/0132110 A1 * | 6/2006 | Tang | ..................... | H02M 3/157 323/282 |

(Continued)

FOREIGN PATENT DOCUMENTS

| | | |
|---|---|---|
| JP | S61-165130 A | 7/1986 |
| JP | S62-178015 A | 8/1987 |
| JP | H02-26413 A | 1/1990 |

(Continued)

*Primary Examiner* — Lam T Mai

(74) *Attorney, Agent, or Firm* — Osha Liang LLP

(57) ABSTRACT

The n-bit decoder circuit includes $2^n$ base circuits each outputting, as the output signal OA, '0', '1' or the input signal IA depending on setting of selection signals S<1:0>; and the (n−1)-bit decoder circuit. The (n−1)-bit decoder circuit includes $2^{(n-1)}$ base circuits and an (n−2)-bit decoder circuit in cases of n≥3, and includes the 1-bit decoder circuit in cases of n=2. The 1-bit decoder circuit outputs '00' in cases of the binary input BIN<0>='0' and outputs '01' in cases of the binary input BIN<0>='1' as thermometer outputs THM(1)<1:0>.

7 Claims, 10 Drawing Sheets

(56) References Cited

U.S. PATENT DOCUMENTS

2014/0103985 A1* 4/2014 Andreev ................ H03K 5/131
327/262

FOREIGN PATENT DOCUMENTS

| JP | H07-235869 A | 9/1995 |
| JP | 2003046388 A | 2/2003 |
| JP | 2008141676 A | 6/2008 |

* cited by examiner

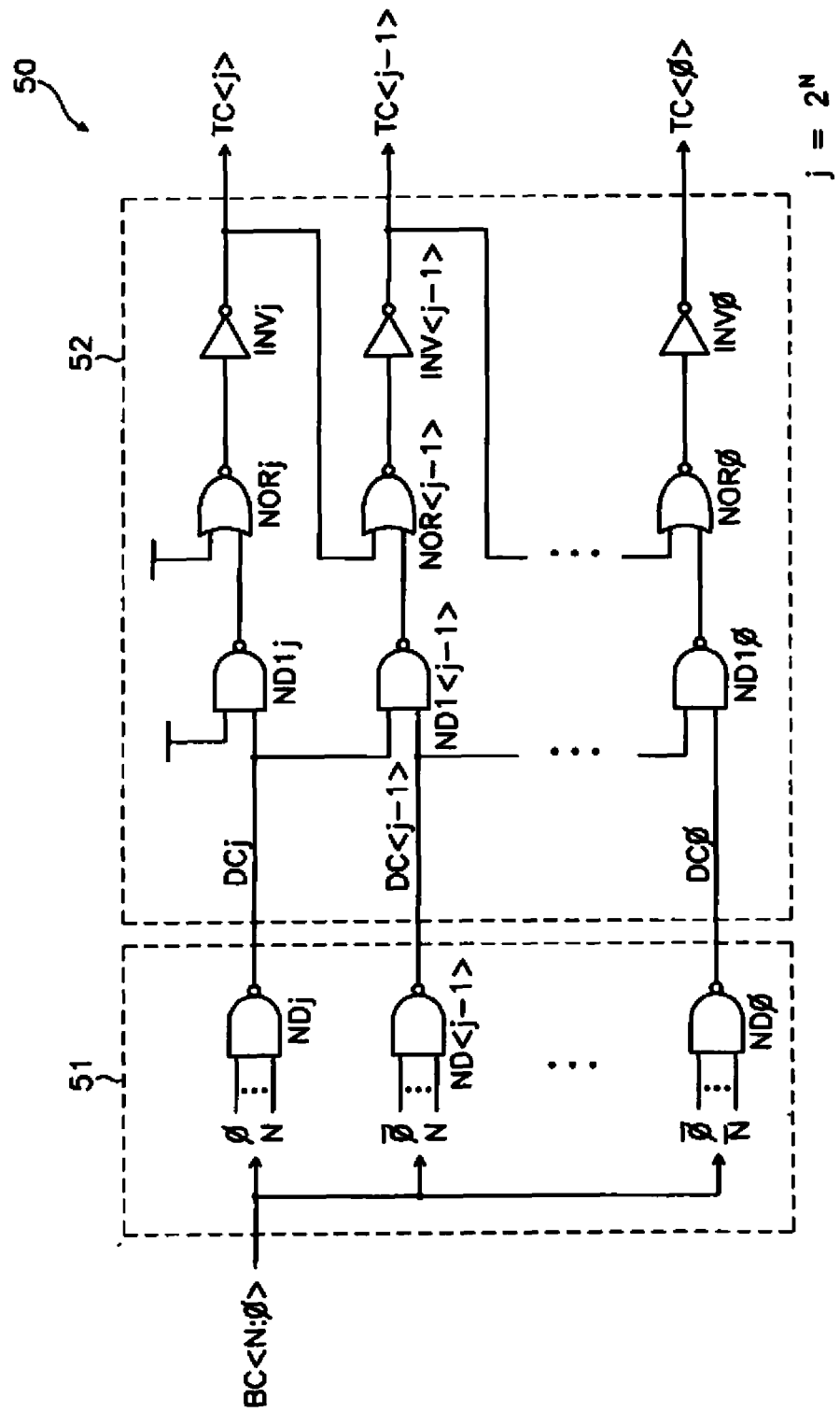

DECODER CIRCUIT AND DECODER CIRCUIT DESIGN METHOD

CROSS-REFERENCE TO RELATED APPLICATIONS

The present application claims priority under 35 U.S.C. § 119 to Japanese Patent Application No. 2018-154599, filed on Aug. 21, 2018. The above application is hereby expressly incorporated by reference, in its entirety, into the present application.

BACKGROUND OF THE INVENTION

The present invention relates to a decoder circuit for decoding and converting n-bit binary inputs representing a binary code into $2^n$ thermometer outputs representing a thermometer code, and a method of designing the decoder circuit.

In order to keep the linearity of an analog output from a current type digital-to-analog converter (DAC), a decoder circuit converts n-bit binary inputs, e.g., 8-bit binary inputs representing a binary code into $2^n$-bit thermometer outputs, e.g., 256-bit thermometer outputs representing a thermometer code, and controls the operation of the DAC using the $2^n$ thermometer outputs.

For instance, a truth table of a 4-bit decoder circuit for decoding and converting 4-bit binary inputs BIN<3:0> into 16-bit thermometer outputs THM<15:0> is represented by Table 1.

$T0 = B3 + B2 + B1 + B0$ $T1 = B3 + B2 + B1$ $T2 = B3 + B2 + B1*B0$ $T3 = B3 + B2$ $T4 = B3 + B2*(B1 + B0)$ $T5 = B3 + B2*B1$ $T6 = B3 + B2*B1*B0$ $T7 = B3$ $T8 = B3*(B2 + B1 + B0)$ $T9 = B3*(B2 + B1)$ $T10 = B3*(B2 + B1*B0)$ $T11 = B3*B2$ $T12 = B3*B2*(B1 + B0)$ $T13 = B3*B2*B1$ $T14 = B3*B2*B1*B0$ $T15 = 0$

In the above, B3 to B0 represent the binary inputs BIN<3:0>, and T15 to T0 represent the thermometer outputs THM<15:0>. Note that T15, i.e., the thermometer output THM<15> is always '0' regardless of the state of the binary inputs BIN<3:0>, as shown in the truth table of Table 1.

FIG. 10 is a circuit diagram showing an example of the configuration of a decoder circuit generated by Method (1). While the decoder circuit generated by Method (1) operates at high speed, the design and the configuration thereof are complicated. When a decoder circuit is of 4-bit like the decoder circuit of FIG. 10, the configuration is not very complicated; however, when a decoder circuit is of 8-bit or the like, the configuration is to be extremely complicated. In addition, it is easily imaginable that the size of the decoder circuit generated by Method (1) increases in proportion not to $2^n$ but to $n \times 2^n$, with n being the number of bits of binary inputs BIN.

TABLE 1

| Binary input BIN | | | | Thermometer output THM | | | | | | | | | | | | | | | |
|---|---|---|---|---|---|---|---|---|---|---|---|---|---|---|---|---|---|---|---|
| <3> | <2> | <1> | <0> | <15> | <14> | <13> | <12> | <11> | <10> | <9> | <8> | <7> | <6> | <5> | <4> | <3> | <2> | <1> | <0> |
| 0 | 0 | 0 | 0 | 0 | 0 | 0 | 0 | 0 | 0 | 0 | 0 | 0 | 0 | 0 | 0 | 0 | 0 | 0 | 0 |
| 0 | 0 | 0 | 1 | 0 | 0 | 0 | 0 | 0 | 0 | 0 | 0 | 0 | 0 | 0 | 0 | 0 | 0 | 0 | 1 |
| 0 | 0 | 1 | 0 | 0 | 0 | 0 | 0 | 0 | 0 | 0 | 0 | 0 | 0 | 0 | 0 | 0 | 0 | 1 | 1 |
| 0 | 0 | 1 | 1 | 0 | 0 | 0 | 0 | 0 | 0 | 0 | 0 | 0 | 0 | 0 | 0 | 0 | 1 | 1 | 1 |
| 0 | 1 | 0 | 0 | 0 | 0 | 0 | 0 | 0 | 0 | 0 | 0 | 0 | 0 | 0 | 0 | 1 | 1 | 1 | 1 |
| 0 | 1 | 0 | 1 | 0 | 0 | 0 | 0 | 0 | 0 | 0 | 0 | 0 | 0 | 0 | 1 | 1 | 1 | 1 | 1 |
| 0 | 1 | 1 | 0 | 0 | 0 | 0 | 0 | 0 | 0 | 0 | 0 | 0 | 0 | 1 | 1 | 1 | 1 | 1 | 1 |
| 0 | 1 | 1 | 1 | 0 | 0 | 0 | 0 | 0 | 0 | 0 | 0 | 0 | 1 | 1 | 1 | 1 | 1 | 1 | 1 |
| 1 | 0 | 0 | 0 | 0 | 0 | 0 | 0 | 0 | 0 | 0 | 0 | 1 | 1 | 1 | 1 | 1 | 1 | 1 | 1 |
| 1 | 0 | 0 | 1 | 0 | 0 | 0 | 0 | 0 | 0 | 0 | 1 | 1 | 1 | 1 | 1 | 1 | 1 | 1 | 1 |
| 1 | 0 | 1 | 0 | 0 | 0 | 0 | 0 | 0 | 0 | 1 | 1 | 1 | 1 | 1 | 1 | 1 | 1 | 1 | 1 |
| 1 | 0 | 1 | 1 | 0 | 0 | 0 | 0 | 0 | 1 | 1 | 1 | 1 | 1 | 1 | 1 | 1 | 1 | 1 | 1 |
| 1 | 1 | 0 | 0 | 0 | 0 | 0 | 0 | 1 | 1 | 1 | 1 | 1 | 1 | 1 | 1 | 1 | 1 | 1 | 1 |
| 1 | 1 | 0 | 1 | 0 | 0 | 0 | 1 | 1 | 1 | 1 | 1 | 1 | 1 | 1 | 1 | 1 | 1 | 1 | 1 |
| 1 | 1 | 1 | 0 | 0 | 0 | 1 | 1 | 1 | 1 | 1 | 1 | 1 | 1 | 1 | 1 | 1 | 1 | 1 | 1 |
| 1 | 1 | 1 | 1 | 0 | 1 | 1 | 1 | 1 | 1 | 1 | 1 | 1 | 1 | 1 | 1 | 1 | 1 | 1 | 1 |

The following methods (1) and (2) are known to realize a 4-bit decoder circuit:

Method (1): A method involving constructing a logic circuit in accordance with the truth table represented by Table 1.

Method (2): A method involving taking AND of all the states of the 4-bit binary inputs BIN<3:0> shown in Table 1 with the use of 16 AND circuits, and setting all the thermometer outputs THM on the lower side from one AND circuit corresponding to the states of actually-input binary inputs BIN<3:0> to '1'.

First, Method (1) generates, for example, those algebraic expressions shown below that satisfy the truth table of Table 1, thereby realizing a specific 4-bit decoder circuit in accordance therewith.

FIG. 11 is a circuit diagram showing one example of the configuration of a decoder circuit generated by Method (2). The decoder circuit shown in FIG. 11 is a code converting unit 50 shown in FIG. 3 of JP 2003-46388 A including a decoder 51 that decodes an n-bit binary code value BC from a binary code generating unit 20 and outputs $2^n$ values DC and a thermometer code converting unit 52 that converts the output values from the decoder 51 into thermometer code values TC.

In the code converting unit 50 shown in FIG. 11, first, the decoder 51 operates such that only an output from one NAND circuit ND corresponding to the state of an actually-input binary code value BC becomes '0' and that one thermometer code value TC corresponding to this one NAND circuit ND becomes '1'. Thereafter, NOR circuits and INV circuits connected in series in the thermometer code converting unit 52 sequentially output '1' as all the thermometer code values TC on the lower side from the one thermometer code value TC.

In the code converting unit 50 shown in FIG. 11, the number of inputs of each of the NAND circuits ND composing the decoder 51 varies depending on the number of bits of the binary code value BC, and in the case of 8 bits, 8-input NAND circuits are needed. Since it is not realistic to realize such an 8-input NAND circuit as it is, it is necessary to realize a circuit equivalent to an 8-input NAND circuit by, for instance, inputting outputs of two 4-input NAND circuits to a 2-input NOR circuit and an INV circuit. The circuit size of the decoder 51 increases in proportion to $n \times 2^n$ (or greater), with n being the number of bits of the binary code value BC.

On the other hand, the circuit size of the thermometer code converting unit 52 is only proportional to $2^n$ and therefore, the size of the entire circuit is not so large compared to a decoder circuit generated by Method (1); however, the thermometer code converting unit 52 is not very flexible to the change in the number of bits of a binary code value BC at any rate. Furthermore, the output propagation delay time until outputting the lowest thermometer code value TC from the group of NOR circuits connected in series is to be extremely long, and this circuit is absolutely disadvantageous in terms of speeding up.

In the meantime, references related to the present invention include, in addition to JP 2003-46388 A, JP 61-165130 A, JP 62-178015 A, JP 2-26413 A, JP 7-235869 A and JP 2008-141676 A.

SUMMARY OF THE INVENTION

The first object of the present invention is to provide a decoder circuit that can deal with a varying number of bits of binary inputs only by preparing very simple and primitive circuits and combining the primitive circuits, as well as a method of designing the decoder circuit.

The second object of the present invention is to provide a decoder circuit in which, in relation to the increase in the number of bits of binary inputs, the increase in size of the decoder circuit is far smaller than the increase in circuit size proportional to $n \times 2^n$, as well as a method of designing the decoder circuit.

The third object of the present invention is to provide a decoder circuit that can make the critical path length as short as possible, as well as a method of designing the decoder circuit.

In order to achieve the above objects, the invention provides an n-bit decoder circuit that decodes and converts n-bit binary inputs BIN<n−1:0> into $2^n$-bit thermometer outputs THM(n)<$2^n$−1:0>, where n is an integer of 2 or more, the n-bit decoder circuit comprising:

$2^n$ base circuits each outputting, as an output signal OA, '0', '1' or an input signal IA depending on setting of selection signals S<1:0>; and an (n−1)-bit decoder circuit, wherein '0' and the binary input BIN<n−1> are linked together and input as selection signals S<1:0> for higher $2^{(n-1)}$ base circuits corresponding to the thermometer outputs THM(n)<$2^n$−1:$2^{(n-1)}$>, and each bit of thermometer outputs THM(n−1)<$2^{(n-1)}$−1:0> output from the (n−1)-bit decoder circuit is input as an input signal IA for the higher $2^{(n-1)}$ base circuits, wherein the higher $2^{(n-1)}$ base circuits output '0' to all bits in cases of the binary input BIN<n−1>='0' and output the thermometer outputs THM(n−1)<$2^{(n-1)}$−1:0> in cases of the binary input BIN<n−1>='1', as the thermometer outputs THM(n)<$2^{(n-1)}$−1:$2^{(n-1)}$>, wherein the binary input BIN<n−1> and '1' are linked together and input as selection signals S<1:0> for lower $2^{(n-1)}$ base circuits corresponding to the thermometer outputs THM(n)<$2^{(n-1)}$−1:0>, and each bit of the thermometer outputs THM(n−1)<$2^{(n-1)}$−1:0> is input as an input signal IA for the lower $2^{(n-1)}$ base circuits, wherein the lower $2^{(n-1)}$ base circuits output the thermometer outputs THM(n−1)<$2^{(n-1)}$−1:0> in cases of the binary input BIN<n−1>='0' and output '1' to all bits in cases of the binary input BIN<n−1>='1', as the thermometer outputs THM(n)<$2^{(n-1)}$−1:0>, wherein in cases of n≥3, the (n−1)-bit decoder circuit includes an (m−1)-bit decoder circuit with m being set with a value from n to 3, and in cases of n=2, the (n−1)-bit decoder circuit includes a 1-bit decoder circuit, where m is an integer of n≥m≥3, wherein with m being set with a value from n to 3, the (m−1)-bit decoder circuit includes $2^{(m-1)}$ base circuits and an (m−2)-bit decoder circuit, and wherein the 1-bit decoder circuit outputs '00' in cases of the binary input BIN<0>='0' and outputs '01' in cases of the binary input BIN<0>='1' as thermometer outputs THM(1)<1:0>.

Here, it is preferred that the base circuit includes a first inverter, a second inverter and an output selection circuit, the first inverter includes a first P type MOS transistor and a first N type MOS transistor, the input signal IA is input to a gate of the first P type MOS transistor and a gate of the first N type MOS transistor, and a drain of the first P type MOS transistor and a drain of the first N type MOS transistor are connected to an internal node, the output selection circuit includes a second P type MOS transistor, a third P type MOS transistor, a second N type MOS transistor and a third N type MOS transistor, the second P type MOS transistor is connected between a power source and a source of the first P type MOS transistor, the third P type MOS transistor is connected between the power source and the internal node, the second N type MOS transistor is connected between a source of the first N type MOS transistor and a ground, the third N type MOS transistor is connected between the internal node and the ground, the selection signal S<1> is input to a gate of the second P type MOS transistor and a gate of the third N type MOS transistor, and the selection signal S<0> is input to a gate of the second N type MOS transistor and a gate of the third P type MOS transistor, and an input terminal of the second inverter is connected to the internal node, and the output signal OA is output from the second inverter.

Also, it is preferred that the 1-bit decoder circuit includes a single base circuit that receives '01' as the selection signals S<1:0> and outputs the binary input BIN <0> as the output signal OA, and
the 1-bit decoder circuit outputs:
'0' as the thermometer output THM(1)<1>; and
the binary input BIN<0> as the thermometer output THM(1)<0> from the single base circuit.

Also, it is preferred that the 1-bit decoder circuit includes a buffer that outputs the binary input BIN <0>, and
the 1-bit decoder circuit outputs:
'0' as the thermometer output THM(1)<1>; and
the binary input BIN<0> as the thermometer output THM(1)<0> from the buffer.

Also, the invention provides a method of designing an n-bit decoder circuit that decodes and converts n-bit binary inputs BIN<n−1:0> into $2^n$-bit thermometer outputs THM(n)<$2^n$−1:0>, where n is an integer of 2 or more, the method comprising:
a step of designing a base circuit that outputs, as an output signal OA, '0', '1' or an input signal IA depending on setting of selection signals S<1:0>;
a step of designing a 1-bit decoder circuit that outputs '00' in cases of the binary input BIN<0>='0' and outputs '01' in cases of the binary input BIN<0>='1' as thermometer outputs THM(1)<1:0>;
a step of, in cases of n≥3, with m being set with a value from 3 to n, designing an (m−1)-bit decoder circuit using $2^{(m-1)}$ base circuits and an (m−2)-bit decoder circuit, where m is an integer of n≥m≥3; and
a step of designing an n-bit decoder circuit using $2^n$ base circuits and an (n−1)-bit decoder circuit,
wherein the step of designing the n-bit decoder circuit includes:
a step of linking '0' and the binary input BIN<n−1> together and inputting them as selection signals S<1:0> for higher $2^{(n-1)}$ base circuits corresponding to the thermometer outputs THM(n)<$2^n$−1:$2^{(n-1)}$>, and inputting each bit of thermometer outputs THM(n−1)<$2^{(n-1)}$−1:0> output from the (n−1)-bit decoder circuit as an input signal IA for the higher $2^{(n-1)}$ base circuits; and
a step of linking the binary input BIN<n−1> and '1' together and inputting them as selection signals S<1:0> for lower $2^{(n-1)}$ base circuits corresponding to the thermometer outputs THM(n)<$2^{(n-1)}$−1:0>, and inputting each bit of the thermometer outputs THM(n−1)<$2^{(n-1)}$−1:0> as an input signal IA for the lower $2^{(n-1)}$ base circuits, and
wherein the step of designing the (m−1)-bit decoder circuit includes:
a step of linking '0' and the binary input BIN<m−2> together and inputting them as selection signals S<1:0> for higher $2^{(m-2)}$ base circuits corresponding to the thermometer outputs THM(m−1)<$2^{(m-2)}$−1:$2^{(m-1)}$>, and inputting each bit of thermometer outputs THM(m−2)<$2^{(m-2)}$−1:0> output from the (m−2)-bit decoder circuit as an input signal IA for the higher $2^{(m-2)}$ base circuits; and
a step of linking the binary input BIN<m−2> and '1' together and inputting them as selection signals S<1:0> for lower $2^{(m-2)}$ base circuits corresponding to the thermometer outputs THM(m−1)<$2^{(m-2)}$−1:0>, and inputting each bit of the thermometer outputs THM(m−2)<$2^{(n-2)}$−1:0> as an input signal IA for the lower $2^{(m-2)}$ base circuits.

According to the present invention, it is possible to realize an n-bit decoder circuit only by combining a plurality of primitive circuits, namely, plural base circuits and a 1-bit decoder circuit. Furthermore, the size of the n-bit decoder circuit is proportional to, for example, the number of the base circuits=$(2 \times 2^n)-3$; thus, the increase in circuit size can be far smaller than the increase in size of a conventional circuit proportional to n×$2^n$. Furthermore, the critical path length only increases in proportion to n which is the number of bits of binary inputs BIN and is therefore sufficiently small.

Furthermore, the n-bit decoder circuit can be designed by combining plural base circuits and a 1-bit decoder circuit in accordance with the number of bits of binary inputs BIN. Furthermore, by measuring the output delay times of the primitive circuits that are the base circuits and the 1-bit decoder circuit in advance, the output delay time of the n-bit decoder circuit can easily be calculated in accordance with the number of bits of the binary inputs BIN. Thus, the n-bit decoder circuit can extremely easily be designed, and the design can be changed in short time even when the number of bits of the binary inputs BIN is changed.

BRIEF DESCRIPTION OF THE DRAWINGS

FIG. 11 is a circuit diagram showing the configuration of a code converting unit shown in FIG. 3 of JP 2003-46388 A.

DETAILED DESCRIPTION OF THE INVENTION

Figure 1:
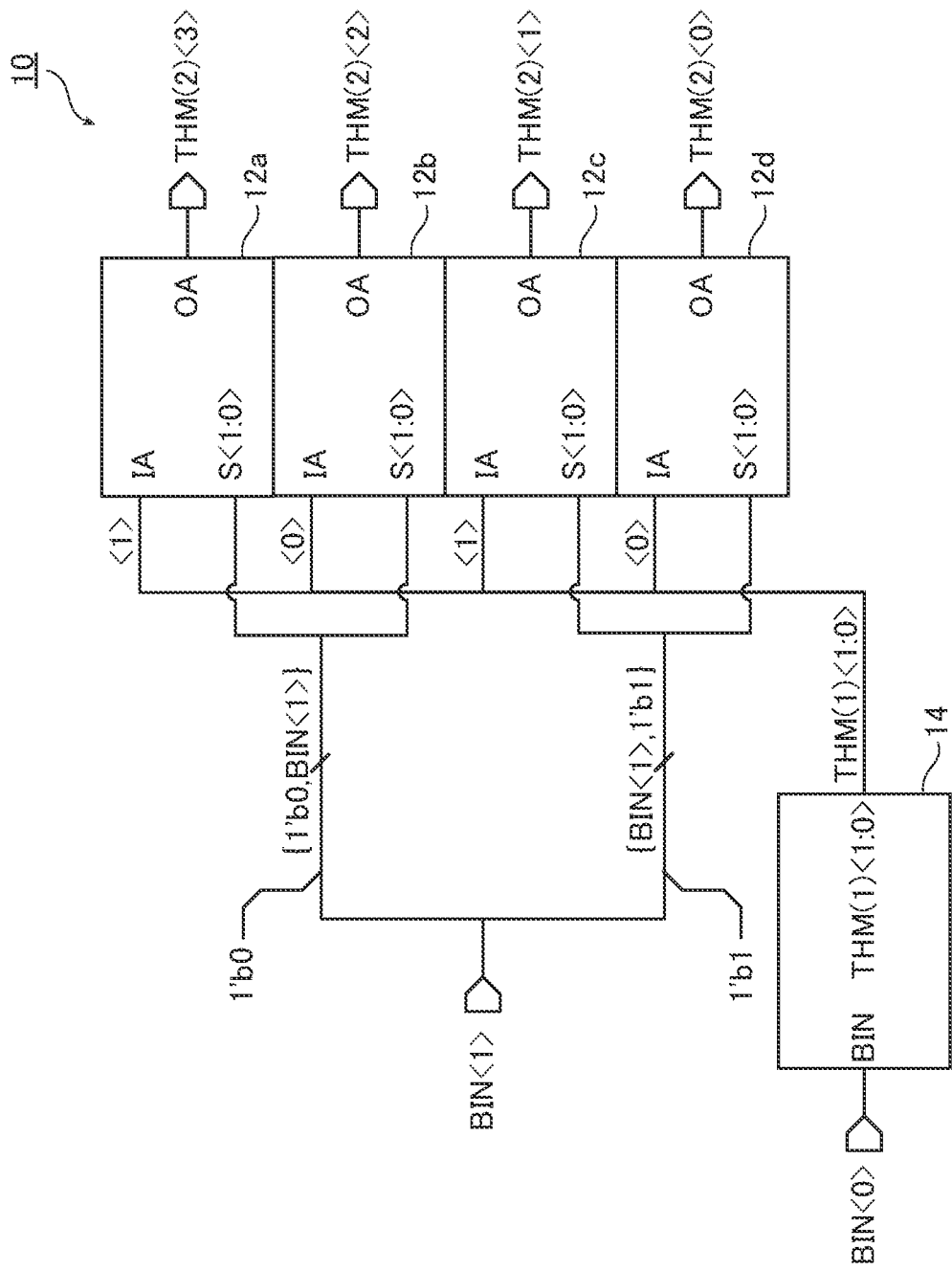
FIG. 1 is a block diagram in a first embodiment showing the configuration of a decoder circuit of the invention.

On the following pages, a decoder circuit and a decoder circuit design method according to the present invention are described in detail with reference to preferred embodiments shown in the accompanying drawings.

A decoder circuit of the present invention can be used to, in a product having for example an n-bit current type DAC (where n is an integer of 2 or more) mounted therein, convert binary inputs BIN representing an n-bit binary code, which are inputs, into thermometer outputs THM representing a $2^n$-bit thermometer code, which are outputs, and control the DAC by the use of these thermometer outputs THM in order to keep the linearity of an analog output from the DAC.

First, a basic algorithm used in designing an n-bit decoder circuit that converts n-bit binary inputs BIN<n−1:0> into $2^n$-bit thermometer outputs THM(n)<$2^n$−1:0> is described below.

The binary inputs BIN<n−1:0> used herein are signals of n-bit bus notation in which the least significant bit (LSB) is a binary input BIN<0> and the most significant bit (MSB)

is a binary input BIN<n−1>. Similarly, the thermometer outputs THM(n)<$2^n$−1:0> are signals of $2^n$-bit bus notation in which the least significant bit is a thermometer output THM(n)<0> and the most significant bit is a thermometer output THM(n)<$2^n$−1>.

It is assumed that an (n−1)-bit decoder circuit that converts (n−1)-bit binary inputs BIN<n−2:0> into $2^{(n-1)}$-bit thermometer outputs (n−1)<$2^{(n-1)}$−1:0> is already present.

Depending on the state of the binary input BIN<n−1> which is the most significant bit of the n-bit binary inputs BIN<n−1:0>, the operation is carried out according to the algorithm described below for each of the thermometer outputs THM(n)<$2^n$−1:0>.

In the case where the binary input BIN<n−1> (which is the most significant bit)='0'

Thermometer outputs THM(n)<$2^n$−1:$2^{(n-1)}$>: '0' is output to each bit.

Thermometer outputs THM(n)<$2^{(n-1)}$−1:0>: The thermometer outputs THM(n−1)<$2^{(n-1)}$−1:0> output from the (n−1)-bit decoder circuit are passed through and output as they are.

In the case where the binary input BIN<n−1> (which is the most significant bit)='1'

Thermometer outputs THM(n)<$2^n$−1:$2^{(n-1)}$>: The thermometer outputs THM(n−1)<$2^{(n-1)}$−1:0> output from the (n−1)-bit decoder circuit are passed through and output as they are.

Thermometer outputs THM(n)<$2^{(n-1)}$−1:0>: '1' is output to each bit.

When the n-bit decoder circuit is designed, the (n−1)-bit decoder circuit needs to be already present as described above, and this condition is established when n≥2 is satisfied. In other words, a 2-bit decoder circuit can be designed according to the foregoing algorithm as long as there is the most basic 1-bit decoder circuit, and any n-bit decoder circuit can be designed by increasing the number of bits like 3 bits, 4 bits, 5 bits, and so on.

TABLE 2

| Binary input BIN | Thermometer output THM | |
|---|---|---|
| <0> | <1> | <0> |
| 0 | 0 | 0 |
| 1 | 0 | 1 |

Table 2 is a truth table representing the operation of a 1-bit decoder circuit, i.e., the relationship between a binary input BIN<0> and thermometer outputs THM(1)<1:0>.

TABLE 3

| Binary input BIN | | Thermometer output THM | | | |
|---|---|---|---|---|---|
| <1> | <0> | <3> | <2> | <1> | <0> |
| 0 | 0 | 0 | 0 | 0 | 0 |
| 0 | 1 | 0 | 0 | 0 | 1 |
| 1 | 0 | 0 | 0 | 1 | 1 |
| 1 | 1 | 0 | 1 | 1 | 1 |

Table 3 is a truth table representing the operation of a 2-bit decoder circuit, i.e., the relationship between 2-bit binary inputs BIN<1:0> and 4-bit thermometer outputs THM(2)<3:0>.

As shown in Tables 2 and 3, within the 4×4 region of the thermometer outputs THM(2)<3:0> in the truth table of the 2-bit decoder circuit, values in the upper left 2×2 region are all '0' while values in the lower right 2×2 region are all '1'. The values in the upper right 2×2 region and the values in the lower left 2×2 region are the same as those of the thermometer outputs THM(1)<1:0> in the truth table of the 1-bit decoder circuit.

This condition is always the same even when the number of bits of binary inputs BIN increases, and in the case of 4 bits for instance, Table 1 mentioned above is established. To be more specific, within the 16×16 region of the thermometer outputs THM(4)<15:0> in the truth table of the 4-bit decoder circuit, values in the upper left 8×8 region are all '0' while values in the lower right 8×8 region are all '1'. The values in the upper right 8×8 region and the values in the lower left 8×8 region are the same as those of thermometer outputs THM(3)<7:0> in the truth table of a 3-bit decoder circuit as shown in Table 5 to be described later.

Thus, it would be understood that when a 2-bit decoder circuit is designed according to the foregoing algorithm with the use of a 1-bit decoder circuit and the number of bits is increased like 3 bits, 4 bits, 5 bits, and so on, any n-bit decoder circuit can easily be designed.

A decoder circuit of the present invention is described with reference to specific examples.

FIG. 1 is a block diagram in a first embodiment showing the configuration of a decoder circuit of the invention. A decoder circuit 10 shown in FIG. 1 is a 2-bit decoder circuit that decodes and converts 2-bit binary inputs BIN<1:0> representing a binary code into 4-bit thermometer outputs THM(2)<3:0> representing a thermometer code.

The 2-bit decoder circuit 10 includes four base circuits 12a, 12b, 12c, 12d and a 1-bit decoder circuit 14.

The base circuits 12a, 12b, 12c, 12d each output, as an output signal OA, '0', '1' or an input signal IA as it is depending on the setting of 2-bit selection signals S<1:0>.

Outputting an input signal IA as it is means letting the input signal IA pass through and outputting a signal having the same value as the input signal IA as an output signal OA.

1-bit data 1'b0 that is fixed to '0' is input to a selection input terminal S<1> of each of higher two base circuits 12a, 12b corresponding to higher 2-bit thermometer outputs THM(2)<3:2>, and a binary input BIN<1> which is the most significant bit of the binary inputs BIN<1:0> is input to a selection input terminal S<0> thereof. 1'b0 is an exemplary description in the hardware description language (HDL) of Verilog and represents the 1-bit binary number '0'. Hereinafter, descriptions are provided in the same manner. In other words, '0' and the binary input BIN<1> are linked together as {1'b0, BIN<1>} and, as the selection signals S<1:0>, input to the higher two base circuits 12a, 12b.

A thermometer output THM(1)<1> output from the 1-bit decoder circuit 14 is input to a signal input terminal IA of the higher base circuit 12a, and a thermometer output THM(1)<0> is input to a signal input terminal IA of the higher base circuit 12b. In other words, each bit of the thermometer outputs THM(1)<1:0> is input as the input signal IA for the higher two base circuits 12a, 12b.

On the other hand, the binary input BIN<1> is input to a selection input terminal S<1> of each of lower two base circuits 12c, 12d corresponding to lower 2-bit thermometer outputs THM(2)<1:0>, and 1-bit data 1'b1 that is fixed to '1' is input to a selection input terminal S<0> thereof. In other words, as the selection signals S<1:0> for the lower two base circuits 12c, 12d, the binary input BIN<1> and '1' are input as {BIN<1>, 1'b1}.

The thermometer output THM(1)<1> is input to a signal input terminal IA of the lower base circuit 12c, and the thermometer output THM(1)<0> is input to a signal input terminal IA of the lower base circuit 12d. In other words, each bit of the thermometer outputs THM(1)<1:0> is input as the input signal IA for the lower two base circuits 12c, 12d.

Thermometer outputs THM(2)<3:0> are output as output signals OA from the signal output terminals OA of the base circuits 12a, 12b, 12c, 12d.

Figure 2:
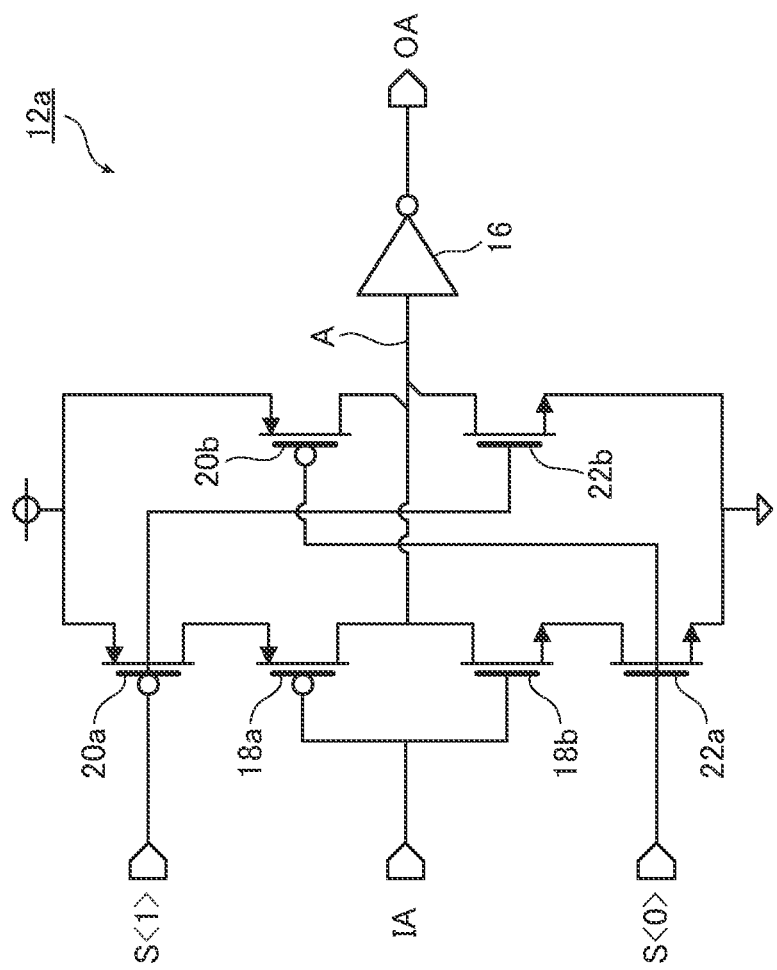
FIG. 2 is a circuit diagram in an embodiment showing the configuration of a base circuit.

FIG. 2 is a circuit diagram in an embodiment showing the configuration of the base circuit. The base circuit 12a shown in FIG. 2 includes a first inverter, a second inverter 16 and an output selection circuit.

The configurations of the base circuits 12b, 12c, 12d are also the same as that of the base circuit 12a.

The first inverter is provided to output an inverted signal of an input signal IA to an internal node A, and includes a first P type MOS transistor (hereinafter also called PMOS) 18a and a first N type MOS transistor (hereinafter also called NMOS) 18b.

The input signal IA is input to the gate of the first PMOS 18a and the gate of the first NMOS 18b. The drain of the first PMOS 18a and the drain of the first NMOS 18b are connected to the internal node A.

The output selection circuit is provided to, in accordance with the setting of the selection signals S<1:0>, switch a signal to be output as an internal signal at the internal node A among '0', '1' and the inverted signal of the input signal IA. The output selection circuit includes a second PMOS 20a, a third PMOS 20b, a second NMOS 22a and a third NMOS 22b.

The second PMOS 20a is connected between a power source and the source of the first PMOS 18a, and the third PMOS 20b is connected between the power source and the internal node A. The second NMOS 22a is connected between the source of the first NMOS 18b and the ground, and the third NMOS 22b is connected between the internal node A and the ground. The selection signal S<1> is input to the gate of the second PMOS 20a and the gate of the third NMOS 22b, and the selection signal S<0> is input to the gate of the second NMOS 22a and the gate of the third PMOS 20b.

The second inverter 16 outputs the inverted signal of the internal signal at the internal node A as an output signal OA. The input terminal of the second inverter 16 is connected to the internal node A, and the output signal OA is output from the second inverter 16.

TABLE 4

| S<1> | S<0> | OA |
|---|---|---|
| 0 | 0 | 0-fixed |
| 0 | 1 | IA through output |
| 1 | 1 | 1-fixed |
| 1 | 0 | Inhibited |

Table 4 is a truth table representing the operation of the base circuit 12a, i.e., the relationship between the 2-bit selection signals S<1:0> and the output signal OA.

As shown in Table 4, in the case of the selection signals S<1:0>='00', the PMOSs 20a, 20b are turned ON and the NMOSs 22a, 22b are turned OFF in the base circuit 12a. In this case, regardless of the value of the input signal IA, the internal node A is charged up via the PMOS 20b and turned to "1", and the internal signal at the internal node A is inverted by the second inverter 16, so that the output signal OA is fixed to '0', i.e., is to be '0'.

In the case of the selection signals S<1:0>='01', the PMOS 20a and the NMOS 22a are turned ON and the PMOS 20b and the NMOS 22b are turned OFF. In this case, the input signal IA is inverted by the first inverter and output to the internal node A, and the internal signal at the internal node A is inverted by the second inverter 16; thus, the output signal OA is in the state where the input signal IA is passed through. In other words, the input signal IA is output as it is as the output signal OA.

In the case of the selection signals S<1:0>='11', the PMOSs 20a, 20b are turned OFF and the NMOSs 22a, 22b are turned ON. In this case, regardless of the value of the input signal IA, the internal node A is discharged via the NMOS 22b and turned to "0", and the internal signal at the internal node A is inverted by the second inverter 16, so that the output signal OA is fixed to '1', i.e., is to be '1'.

In the case of the selection signals S<1:0>='10', the PMOS 20a and the NMOS 22a are turned OFF and the PMOS 20b and the NMOS 22b are turned ON. In this case, since a direct current flows from the power source to the ground via the PMOS 20b and the NMOS 22b, input of the selection signals S<1:0>="10" is inhibited.

In the 2-bit decoder circuit 10 shown in FIG. 1, the 1-bit data 1'b0 is input to the selection input terminal S<1> of each of the base circuits 12a, 12b, and the selection signal S<1>='0' is fixed. The 1-bit data 1'b1 is input to the selection input terminal S<0> of each of the base circuits 12c, 12d, and the selection signal S<0>='1' is fixed. In other words, it is configured such that the selection signals S<1:0> that lead to the selection signals S<1:0>='10' are not input.

Note that a base circuit having an arbitrary configuration that realizes the truth table shown in Table 4 is applicable to the base circuit 12a.

Figure 9:
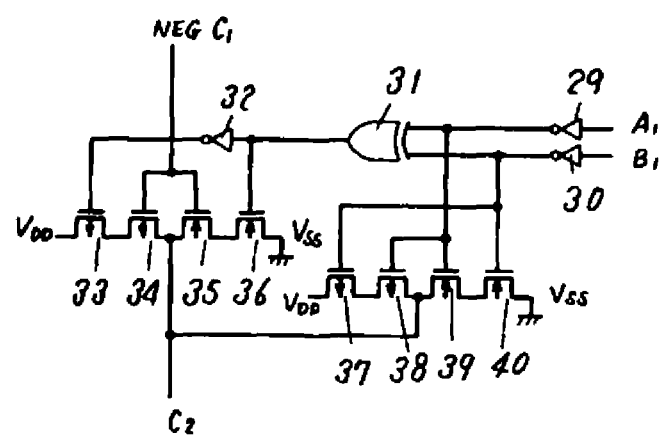
FIG. 9 is a circuit diagram showing the configuration of a carry signal generation circuit shown in FIG. 2 of JP 61-165130 A.
Figure 10:
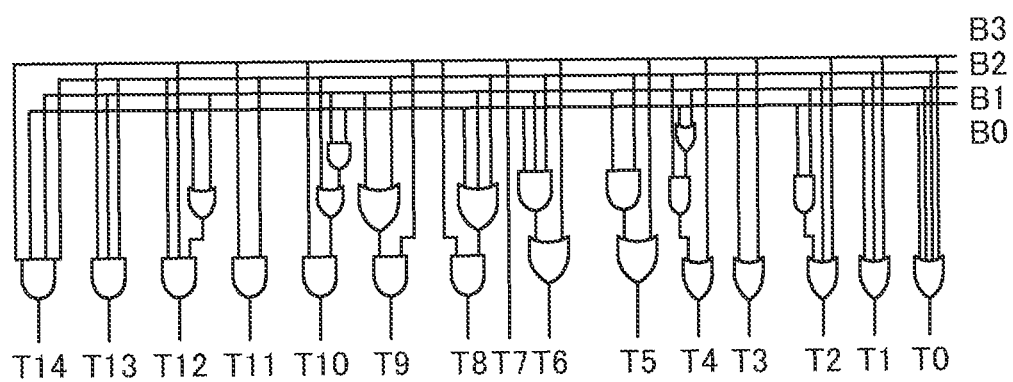
FIG. 10 is a circuit diagram showing an example of the configuration of a 4-bit decoder circuit.

For example, as shown in FIG. 9, when A1, B1 and NEG C1 in the carry signal generation circuit shown in FIG. 2 of JP 61-165130 A are replaced by the selection signal S<1>, the selection signal S<0> and the input signal IA, respectively, a base circuit that realizes the truth table shown in Table 4 can be obtained. The base circuit 12a according to the present invention is remarkably different, however, because it specializes in conversion from a binary code to a thermometer code and inhibits input of the selection signals S<1:0>='10', thereby achieving considerable simplification of the circuit size.

Subsequently, the 1-bit decoder circuit 14 decodes and converts a 1-bit binary input BIN<0> into 2-bit thermometer outputs THM(1)<1:0>.

The binary input BIN<0> is input to a binary input terminal BIN of the 1-bit decoder circuit 14. The 2-bit thermometer outputs THM(1)<1:0> are output from thermometer output terminals THM(1)<1:0> of the 1-bit decoder circuit 14.

The 1-bit decoder circuit 14 always outputs '0' as the thermometer output THM(1)<1>, as shown in Table 2 above. The 1-bit decoder circuit 14 also outputs the binary input BIN<0> as it is as the thermometer output THM(1)<0>. In other words, the 1-bit decoder circuit 14 outputs '00' in the case of the binary input BIN<0>='0' and outputs '01' in the case of the binary input BIN<0>='1' as the thermometer outputs THM(1)<1:0>.

Next, the configuration of the 1-bit decoder circuit 14 is described with reference to specific examples.

Figure 3:
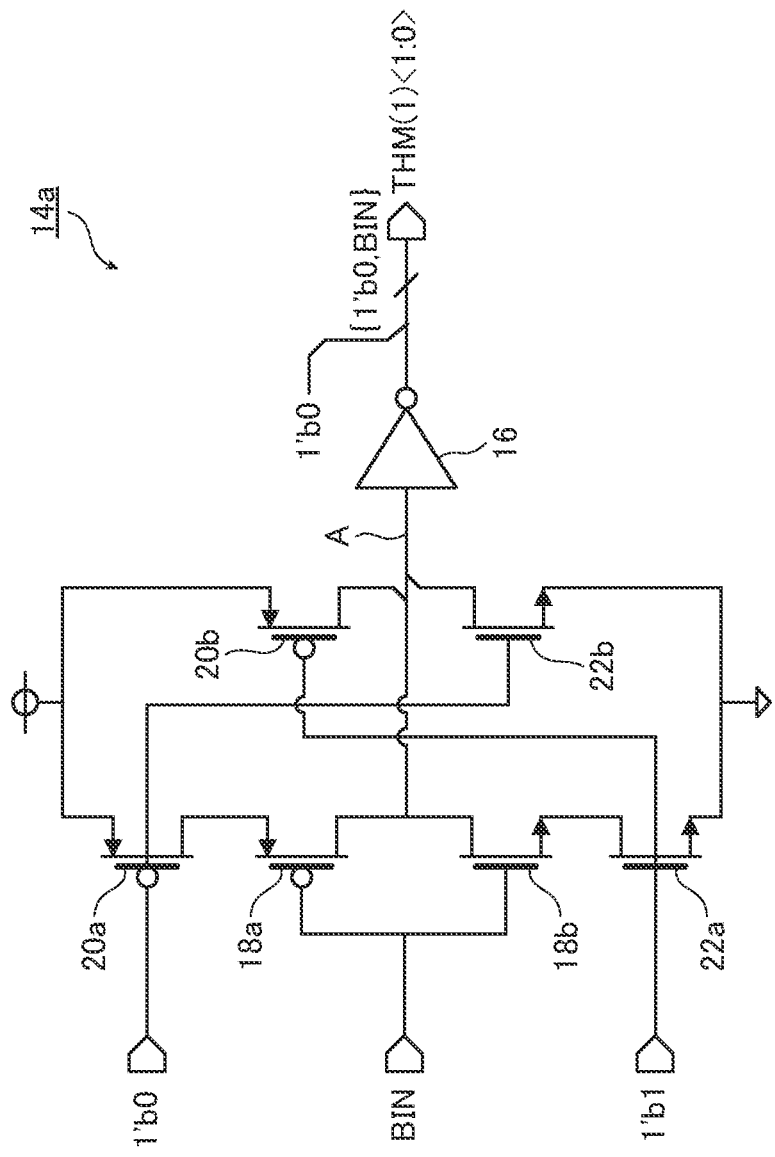
FIG. 3 is a circuit diagram in a first embodiment showing the configuration of a 1-bit decoder circuit.

FIG. 3 is a circuit diagram in a first embodiment showing the configuration of a 1-bit decoder circuit. A 1-bit decoder circuit 14a shown in FIG. 3 includes a single base circuit having the same configuration as the base circuit 12a shown in FIG. 2.

The 1-bit data 1'b0 that is fixed to '0' is input to the selection input terminal S<1> of the single base circuit, and the 1-bit data 1'b1 that is fixed to '1' is input to the selection input terminal S<0> thereof. That is, '01' is input as the selection signals S<1:0> for the single base circuit. The binary input BIN<0> is input to the binary input terminal BIN of the single base circuit (refer to FIG. 1).

The 1-bit data 1'b0 that is fixed to '0' is connected to the thermometer output THM(1)<1>.

In the 1-bit decoder circuit 14a, the thermometer output THM(1)<1> is fixed to '0', i.e., is '0'. That is, the 1-bit decoder circuit 14a always outputs '0' as the thermometer output THM(1)<1>, as shown in Table 2.

With the selection signals S<1:0>='01', the PMOS 20a and the NMOS 22a are in the ON state while the PMOS 20b and the NMOS 22b are in the OFF state, and the single base circuit lets the input signal IA pass through and outputs the same as it is as the output signal OA. That is, the 1-bit decoder circuit 14a outputs the binary input BIN <0> as it is as the thermometer output THM(1)<0>, as shown in Table 2.

Thus, by fixing the selection signals S<1:0>='01', the 1-bit decoder circuit 14a uses the base circuit 12a as a buffer, outputs the output signal OA therefrom as the thermometer output THM(1)<0>, and further outputs the '0' fixed signal as the thermometer output THM(1)<1>; thus the 1-bit decoder circuit 14a can easily be realized. In this case, without designing a dedicated circuit as a 1-bit decoder circuit, an n-bit decoder circuit 14a can be realized by means only of the single base circuit.

Figure 4:
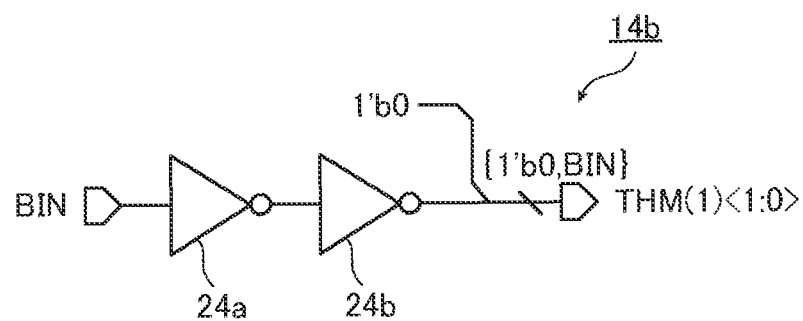
FIG. 4 is a circuit diagram in a second embodiment showing the configuration of a 1-bit decoder circuit.

FIG. 4 is a circuit diagram in a second embodiment showing the configuration of a 1-bit decoder circuit. A 1-bit decoder circuit 14b shown in FIG. 4 includes two inverters 24a, 24b connected in series, i.e., a buffer.

The binary input BIN<0> is input to an input terminal of the upstream inverter, that is, the binary input terminal BIN of the 1-bit decoder circuit 14b (refer to FIG. 1), and the thermometer output THM(1)<0> is output from an output terminal of the downstream inverter.

The 1-bit data 1'b0 that is fixed to '0' is connected to the thermometer output THM(1)<1>.

In the 1-bit decoder circuit 14b, the thermometer output THM(1)<1> is fixed to '0', i.e., is '0'. That is, the 1-bit decoder circuit 14b always outputs '0' as the thermometer output THM(1)<1>, as shown in Table 2.

Further, the 1-bit decoder circuit 14b inverts the binary input BIN<0> two times by the inverters 24a, 24b and outputs the binary input BIN <0> as it is as the thermometer output THM(1)<0>, as shown in Table 2, from the buffer.

The 1-bit decoder circuit 14b can easily be realized by outputting the output signal from the buffer as the thermometer output THM(1)<0> and further outputting the '0' fixed signal as the thermometer output THM(1)<1>. In this case, the 1-bit decoder circuit can be realized using an extremely simple circuit that only includes the buffer composed of the two inverters 24a, 24b.

Note that a 1-bit decoder circuit having an arbitrary configuration that realizes the truth table shown in Table 2 is applicable to the 1-bit decoder circuit 14.

Next, the operation of the 2-bit decoder circuit 10 is described.

In the 2-bit decoder circuit 10, in the case of the binary input BIN<1>='0', '0' and the binary input BIN<1>, i.e., {1'b0, BIN<1>}='00', are input to the selection input terminals S<1:0> of the higher two base circuits 12a, 12b as the selection signals S<1:0>. In this case, "00" is output from the signal output terminals OA of the two base circuits 12a, 12b as the thermometer outputs THM(2)<3:2>, as shown in Table 3 above.

In the case of the binary input BIN<1>='0', the binary input BIN<1> and '1', i.e., {BIN<1>, 1'b1}='01', are input to the selection input terminals S<1:0> of the lower two base circuits 12c, 12d as the selection signals S<1:0>. In this case, the thermometer outputs THM(1)<1:0> output from the 1-bit decoder circuit 14 are output from the signal output terminals OA of the two base circuits 12c, 12d as they are as the thermometer outputs THM(2)<1:0>, as shown in Table 3.

In other words, as the thermometer outputs THM(2)<1:0>, '00' is output in the case of the binary input BIN<0>='0' and '01' is output in the case of the binary input BIN<0>='1'.

In the case of the binary input BIN<1>='1', '0' and the binary input BIN<1>, i.e., {1'b0, BIN<1>}='01', are input to the selection input terminals S<1:0> of the higher two base circuits 12a, 12b as the selection signals S<1:0>. In this case, the thermometer outputs THM(1)<1:0> output from the 1-bit decoder circuit 14 are output from the signal output terminals OA of the two base circuits 12a, 12b as they are as the thermometer outputs THM(2)<3:2>, as shown in Table 3.

In other words, as the thermometer outputs THM(2)<3:2>, '00' is output in the case of the binary input BIN<0>='0' and '01' is output in the case of the binary input BIN<0>='1'.

In the case of the binary input BIN<1>='1', the binary input BIN<1> and '1', i.e., {BIN<1>, 1'b1}='11', are input to the selection input terminals S<1:0> of the lower two base circuits 12c, 12d as the selection signals S<1:0>. In this case, "11" is output from each of the signal output terminals OA of the two base circuits 12c, 12d as the thermometer outputs THM(2)<1:0>, as shown in Table 3.

Figure 5:
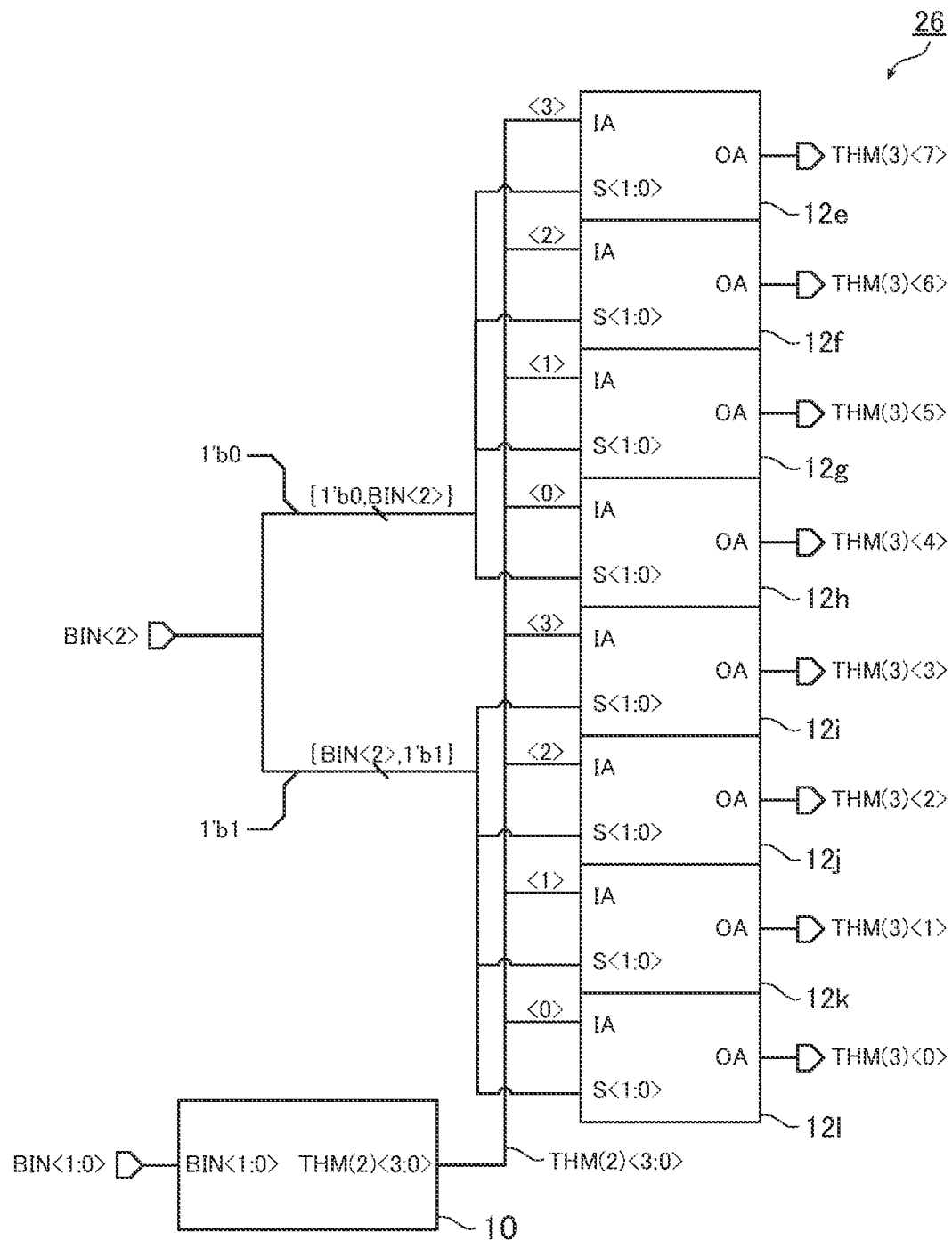
FIG. 5 is a block diagram in a second embodiment showing the configuration of a decoder circuit of the invention.

Next, FIG. 5 is a block diagram in a second embodiment showing the configuration of a decoder circuit of the invention. A decoder circuit 26 shown in FIG. 5 is a 3-bit decoder circuit that decodes and converts 3-bit binary inputs BIN<2:0> into 8-bit thermometer outputs THM(3)<7:0>.

The 3-bit decoder circuit 26 includes eight base circuits 12e, 12f, 12g, 12h, 12i, 12j, 12k, 12l and the 2-bit decoder circuit 10.

1-bit data 1'b0 that is fixed to '0' is input to a selection input terminal S<1> of each of higher four base circuits 12e, 12f, 12g, 12h corresponding to higher 4-bit thermometer outputs THM(3)<7:4>, and a binary input BIN<2> which is the most significant bit of the binary inputs BIN<2:0> is input to a selection input terminal S<0> thereof. In other words, '0' and the binary input BIN<2> are linked together as {1'b0, BIN<2>} and input to the higher four base circuits 12e, 12f, 12g, 12h as the selection signals S<1:0>.

A thermometer output THM(2)<3> output from the 2-bit decoder circuit 10 is input to a signal input terminal IA of the higher base circuit 12e, a thermometer output THM(2)<2> is input to a signal input terminal IA of the higher base circuit 12f, a thermometer output THM(2)<1> is input to a signal input terminal IA of the higher base circuit 12g, and a thermometer output THM(2)<0> is input to a signal input terminal IA of the higher base circuit 12h. In other words, each bit of the thermometer outputs THM(2)<3:0> is input as the input signal IA for the higher four base circuits 12e, 12f, 12g, 12h.

On the other hand, a binary input BIN<2> is input to a selection input terminal S<1> of each of lower four base circuits 12i, 12j, 12k, 12l corresponding to lower 4-bit thermometer outputs THM(3)<3:0>, and 1-bit data 1'b1 that is fixed to '1' is input to a selection input terminal S<0> thereof. In other words, as the selection signals S<1:0> for the lower four base circuits 12*i*, 12*j*, 12*k*, 12*l*, the binary input BIN<2> and '1' are linked together and input as {BIN<2>, 1'b1}.

A thermometer output THM(2)<3> is input to a signal input terminal IA of the lower base circuit 12*i*, a thermometer output THM(2)<2> is input to a signal input terminal IA of the lower base circuit 12*j*, a thermometer output THM(2)<1> is input to a signal input terminal IA of the lower base circuit 12*k*, and a thermometer output THM(2)<0> is input to a signal input terminal IA of the lower base circuit 12*l*. In other words, each bit of the thermometer output THM(2)<3:0> is input as the input signal IA for the lower four base circuits 12*i*, 12*j*, 12*k*, 12*l*.

Thermometer outputs THM(3)<7:0> are output from the signal output terminals OA of the base circuits 12*e*, 12*f*, 12*g*, 12*h*, 12*i*, 12*j*, 12*k*, 12*l*.

The configurations of the base circuits 12*e*, 12*f*, 12*g*, 12*h*, 12*i*, 12*j*, 12*k*, 12*l* are the same as the base circuits used in the 2-bit decoder circuit 10 and as shown in FIG. 2.

The 2-bit decoder circuit 10, which is as shown in FIG. 1 decodes and converts 2-bit binary inputs BIN<1:0> into 4-bit thermometer outputs THM(2)<3:0>.

The binary inputs BIN<1:0> are input to binary input terminals BIN<1:0> of the 2-bit decoder circuit 10. The 4-bit thermometer outputs THM(2)<3:0> are output from thermometer output terminals THM(2)<3:0> of the 2-bit decoder circuit 10.

Next, the operation of the 3-bit decoder circuit 26 is described.

TABLE 5

| Binary input BIN | | | Thermometer output THM | | | | | | | |
|---|---|---|---|---|---|---|---|---|---|---|
| <2> | <1> | <0> | <7> | <6> | <5> | <4> | <3> | <2> | <1> | <0> |
| 0 | 0 | 0 | 0 | 0 | 0 | 0 | 0 | 0 | 0 | 0 |
| 0 | 0 | 1 | 0 | 0 | 0 | 0 | 0 | 0 | 0 | 1 |
| 0 | 1 | 0 | 0 | 0 | 0 | 0 | 0 | 0 | 1 | 1 |
| 0 | 1 | 1 | 0 | 0 | 0 | 0 | 0 | 1 | 1 | 1 |
| 1 | 0 | 0 | 0 | 0 | 0 | 0 | 1 | 1 | 1 | 1 |
| 1 | 0 | 1 | 0 | 0 | 0 | 1 | 1 | 1 | 1 | 1 |
| 1 | 1 | 0 | 0 | 0 | 1 | 1 | 1 | 1 | 1 | 1 |
| 1 | 1 | 1 | 0 | 1 | 1 | 1 | 1 | 1 | 1 | 1 |

Table 5 is a truth table representing the operation of the 3-bit decoder circuit, i.e., the relationship between the 3-bit binary inputs BIN<2:0> and the 8-bit thermometer outputs THM(3)<7:0>.

In the 3-bit decoder circuit 26, in the case of the binary input BIN<2>='0', '0' and the binary input BIN<2>, i.e., {1'b0, BIN<2>}='00', are input to the selection input terminals S<1:0> of the higher four base circuits 12*e*, 12*f*, 12*g*, 12*h* as the selection signals S<1:0>. In this case, "0000" is output from the signal output terminals OA of the four base circuits 12*e*, 12*f*, 12*g*, 12*h* as the thermometer outputs THM(3)<7:4>, as shown in Table 5.

In the case of the binary input BIN<2>='0', the binary input BIN<2> and '1', i.e., {BIN<2>, 1'b1}='01', are input to the selection input terminals S<1:0> of the lower four base circuits 12*i*, 12*j*, 12*k*, 12*l* as the selection signals S<1:0>. In this case, the thermometer outputs THM(2)<3:0> output from the 2-bit decoder circuit 10 are output from the signal output terminals OA of the four base circuits 12*i*, 12*j*, 12*k*, 12*l* as they are as the thermometer outputs THM(3)<3:0>, as shown in Table 5.

In other words, as the thermometer outputs THM(3)<3:0>, '0000' is output in the case of the binary input BIN<1:0>='00', '0001' is output in the case of the binary input BIN<1:0>='01', '0011' is output in the case of the binary input BIN<1:0>='10', and '0111' is output in the case of the binary input BIN<1:0>='11'.

In the case of the binary input BIN<2>='1', '0' and the binary input BIN<2>, i.e., {1'b0, BIN<2>}='01', are input to the selection input terminals S<1:0> of the higher four base circuits 12*e*, 12*f*, 12*g*, 12*h* as the selection signals S<1:0>. In this case, the thermometer outputs THM(2)<3:0> output from the 2-bit decoder circuit 10 are output from the signal output terminals OA of the four base circuits 12*e*, 12*f*, 12*g*, 12*h* as they are as the thermometer outputs THM(3)<7:4>, as shown in Table 5.

In other words, as the thermometer outputs THM(3)<3:0>, '0000' is output in the case of the binary input BIN<1:0>='00', '0001' is output in the case of the binary input BIN<1:0>='01', '0011' is output in the case of the binary input BIN<1:0>='10', and '0111' is output in the case of the binary input BIN<1:0>='11'.

In the case of the binary input BIN<2>='1', the binary input BIN<2> and '1', i.e., {BIN<2>, 1'b1}='11', are input to the selection input terminals S<1:0> of the lower four base circuits 12*i*, 12*j*, 12*k*, 12*l* as the selection signals S<1:0>. In this case, "1111" is output from the signal output terminals OA of the four base circuits 12*i*, 12*j*, 12*k*, 12*l* as the thermometer outputs THM(3)<3:0>, as shown in Table 5.

The configuration of an n-bit decoder circuit that decodes and converts n-bit binary inputs BIN<n-1:0> into $2^n$-bit thermometer outputs THM(n)<$2^n$-1:0> is also the same.

The n-bit decoder circuit includes $2^n$ base circuits and an (n-1)-bit decoder circuit.

'0' and a binary input BIN<n-1> are linked together as {1'b0, BIN<n-1>} and input as selection signals S<1:0> for higher $2^{(n-1)}$ base circuits corresponding to thermometer outputs THM(n)<$2^n$-1:$22^{(n-1)}$>. Each bit of thermometer outputs THM(n-1)<$2^{(n-1)}$-1:0> output from the (n-1)-bit decoder circuit is input as an input signal IA for the higher $2^{(n-1)}$ base circuits.

The higher $2^{(n-1)}$ base circuits output '0' to all the bits of the thermometer outputs THM(n)<$2^n$-1:$22^{(n-1)}$> in the case of the binary input BIN<n-1>='0' and output the thermometer outputs THM(n-1)<$2^{(n-1)}$-1:0> in the case of the binary input BIN<n-1>='1', as the thermometer outputs THM(n)<$2^n$-1:$22^{(n-1)}$>.

On the other hand, the binary input BIN<n-1> and '1' are linked together as {BIN<n-1>, 1'b1} and input as selection signals S<1:0> for lower $2^{(n-1)}$ base circuits corresponding to thermometer outputs THM(n)<$2^{(n-1)}$-1:0>. Also, each bit of the thermometer outputs THM(n-1)<$2^{(n-1)}$-1:0> is input as an input signal IA for the lower $2^{(n-1)}$ base circuits.

The lower $2^{(n-1)}$ base circuits output the thermometer outputs THM(n-1)<$2^{(n-1)}$-1:0> in the case of the binary input BIN<n−1>='0' and output '1' to all the bits of the thermometer outputs THM(n)<$2^{(n-1)}$−1:0> in the case of the binary input BIN<n−1>='1', as the thermometer outputs THM(n)<$2^{(n-1)}$−1:0>.

In the case of n≥3, the (n−1)-bit decoder circuit includes an (m−1)-bit decoder circuit with m (which is an integer of n≥m≥3) being set with a value from n to 3; in the case of n=2, the (n−1)-bit decoder circuit includes a 1-bit decoder circuit.

With m being set with a value from n to 3, the (m−1)-bit decoder circuit includes $2^{(m-1)}$ base circuits and an (m−2)-bit decoder circuit.

Figure 6:
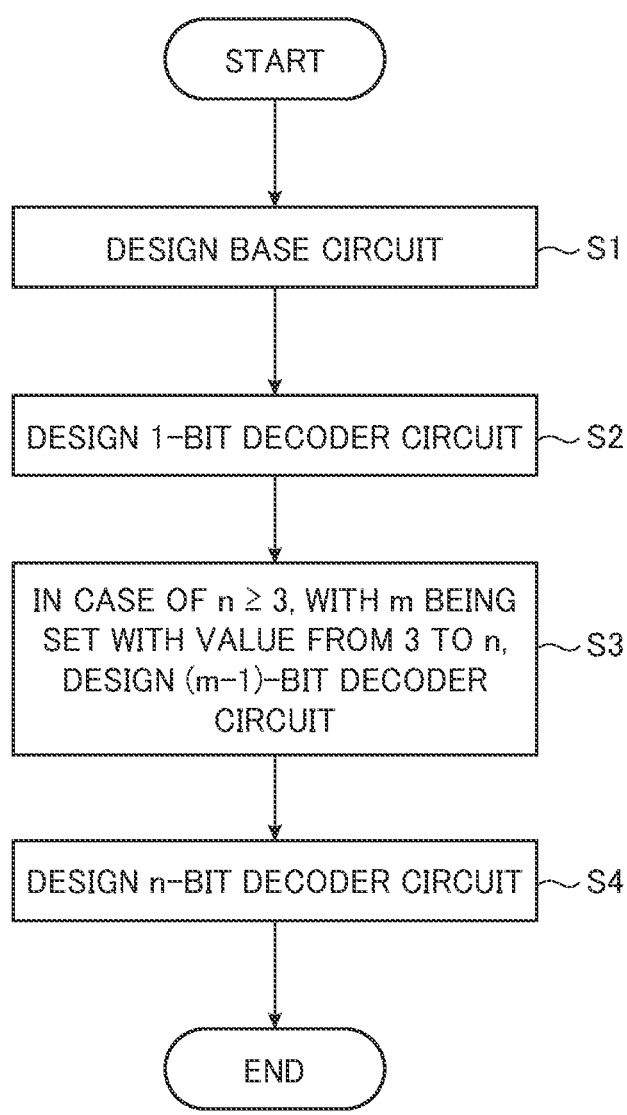
FIG. 6 is a flowchart in an embodiment showing the procedure for designing a decoder circuit of the invention.
Figure 7:
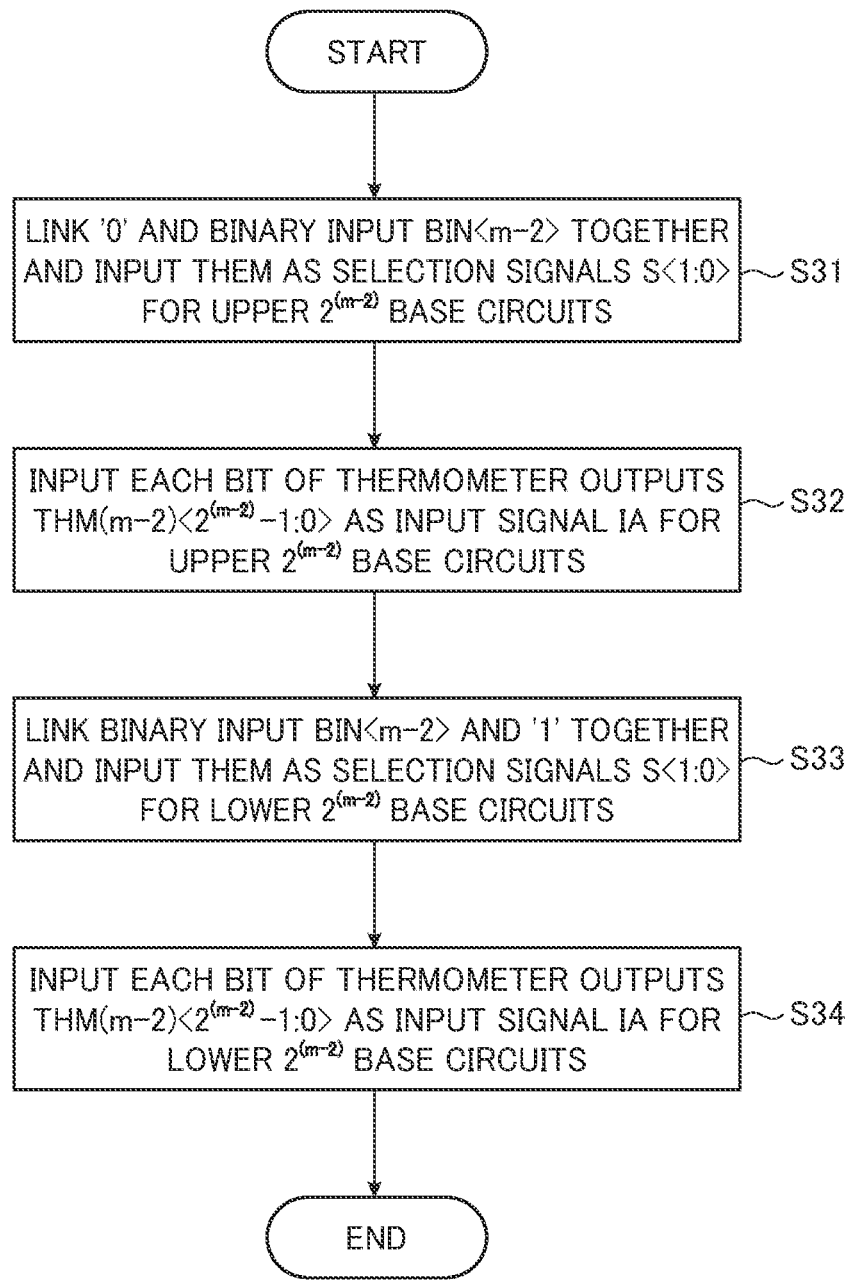
FIG. 7 is a flowchart in an embodiment showing the procedure for designing an (m−1)-bit decoder circuit.
Figure 8:
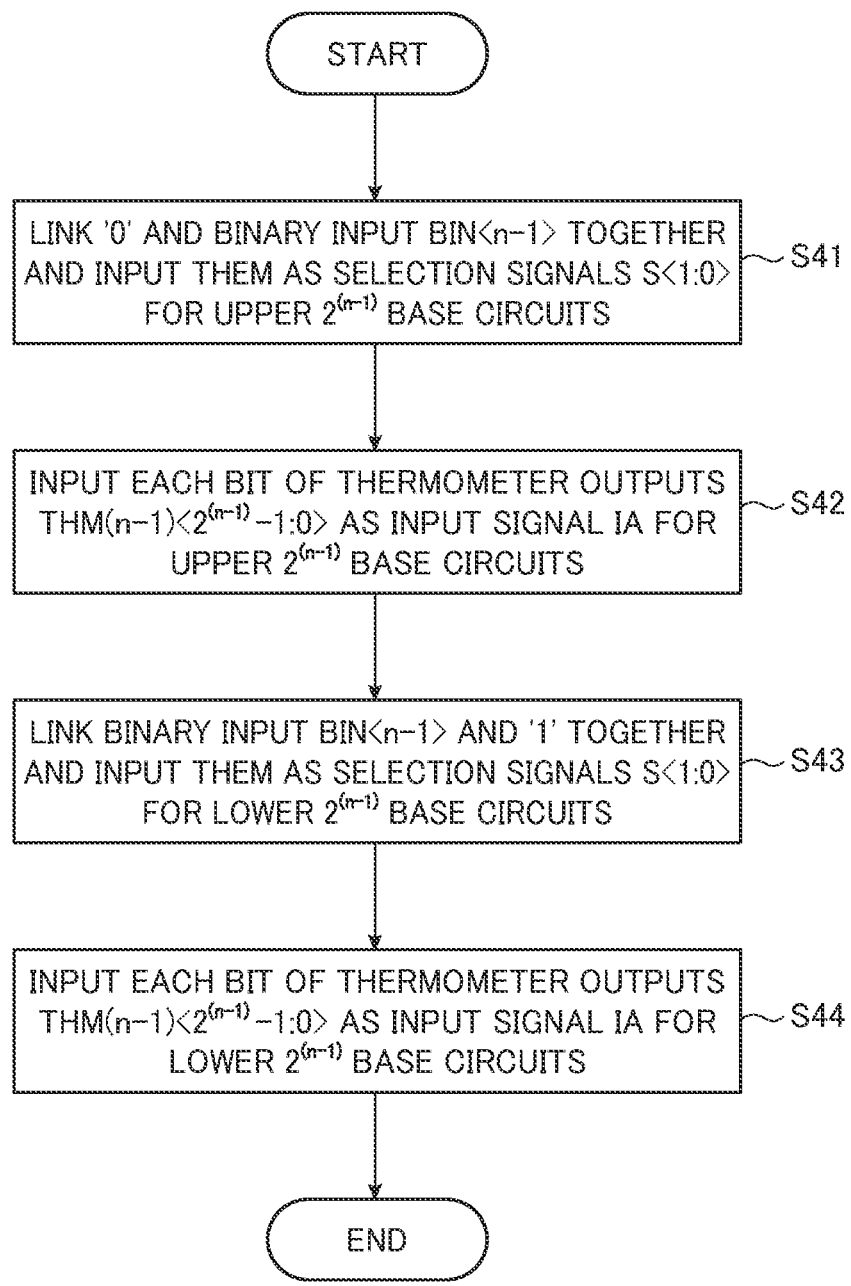
FIG. 8 is a flowchart in an embodiment showing the procedure for designing an n-bit decoder circuit.

Now referring to the flowcharts in FIGS. 6 to 8, the procedure for designing the n-bit decoder circuit according to a decoder circuit design method of the invention is described.

First, a base circuit outputting, as an output signal OA, '0', '1' or an input signal IA depending on the setting of selection signals S<1:0> is designed (Step S1 in FIG. 6). For instance, the base circuit 12*a* shown in FIG. 2 is designed.

A 1-bit decoder circuit outputting '00' in the case of the binary input BIN<0>='0' and outputting '01' in the case of the binary input BIN<0>='1' as thermometer outputs THM(1)<1:0> is designed (Step S2 in FIG. 6). For instance, the 1-bit decoder circuit 14*a* shown in FIG. 3 or the 1-bit decoder circuit 14*b* shown in FIG. 4 is designed. For example, the base circuit 12*a* shown in FIG. 2 is designed, and the 1-bit decoder circuit 14*a* shown in FIG. 3 or the 1-bit decoder circuit 14*b* shown in FIG. 4 is designed.

Subsequently, in the case of n≥3, with m (which is an integer of n≥m≥3) being set with a value from 3 to n, the (m−1)-bit decoder circuit is designed using $2^{(m-1)}$ base circuits and an (m−2)-bit decoder circuit (Step S3 in FIG. 6).

Here, when the (m−1)-bit decoder circuit is designed, '0' and a binary input BIN<m−2> are linked together as {1'b0, BIN<m−2>} and input as selection signals S<1:0> for higher $2^{(m-2)}$ base circuits corresponding to thermometer outputs THM(m−1)<$2^{(m-1)}$−1:$22^{(m-1)}$> (Step S31 in FIG. 7).

Each bit of thermometer outputs THM(m−2)<$2^{(m-2)}$−1:0> output from the (m−2)-bit decoder circuit is input as an input signal IA for the higher $2^{(m-2)}$ base circuits (Step S32 in FIG. 7).

On the other hand, the binary input BIN<m−2> and '1' are linked together as {BIN<m−2>, 1'b1} and input as selection signals S<1:0> for lower $2^{(m-2)}$ base circuits corresponding to thermometer outputs THM(m−1)<$2^{(m-2)}$−1:0> (Step S33 in FIG. 7).

Each bit of thermometer outputs THM(m−2)<$2^{(m-2)}$−1:0> is input as an input signal IA for the lower $2^{(m-2)}$ base circuits (Step S34 in FIG. 7).

Referring back to the flowchart in FIG. 6, after designing the (n−1)-bit decoder circuit is finished, the n-bit decoder circuit is designed using the $2^n$ base circuits and the (n−1)-bit decoder circuit (Step S4 in FIG. 6).

Here, when the n-bit decoder circuit is designed, '0' and a binary input BIN<n−1> are linked together as {1'b0, BIN<n−1>} and input as selection signals S<1:0> for higher $2^{(n-1)}$ base circuits corresponding to thermometer outputs THM(n)<$2^n$−1:$2^{(n-1)}$> (Step S41 in FIG. 8).

Each bit of thermometer outputs THM(n−1)<$2^{(n-1)}$−1:0> output from the (n−1)-bit decoder circuit is input as an input signal IA for the higher $2^{(n-1)}$ base circuits (Step S42 in FIG. 8).

On the other hand, the binary input BIN<n−1> and '1' are linked together as {BIN<n−1>, 1'b1} and input as selection signals S<1:0> for lower $2^{(n-1)}$ base circuits corresponding to thermometer outputs THM(n)<$2^{(n-1)}$−1:0> (Step S43 in FIG. 8).

Each bit of thermometer outputs THM(n−1)<$2^{(n-1)}$−1:0> is input as an input signal IA for the lower $2^{(n-1)}$ base circuits (Step S44 in FIG. 8).

For instance, in the case of n=4, first, the 2-bit decoder circuit 10 shown in FIG. 1 is designed using the four base circuits and the 1-bit decoder circuit. Subsequently, the 3-bit decoder circuit 26 shown in FIG. 5 is designed using the eight base circuits and the 2-bit decoder circuit. Thereafter, a 4-bit decoder circuit is designed using 16 base circuits and the 3-bit decoder circuit 26. Also in the case of n≥5, the n-bit decoder circuit can be designed in the same manner.

As described above, the n-bit decoder circuit according to the invention can be realized using the combination of $2^n$ base circuits and an (n−1)-bit decoder circuit.

Thus, it is possible to realize the n-bit decoder circuit only by combining a plurality of primitive circuits, namely, plural base circuits and a 1-bit decoder circuit. Furthermore, when the 1-bit decoder circuit 14*a* is used for example, the size of the resulting n-bit decoder circuit is proportional to the number of the base circuits 12=($2 \times 2^n$)−3; thus, the increase in circuit size can be far smaller than the increase in size of a conventional circuit proportional to $n \times 2^n$. Furthermore, the critical path length only increases in proportion to n which is the number of bits of binary inputs BIN and is therefore sufficiently small.

Furthermore, the n-bit decoder circuit can be designed by combining plural base circuits and a 1-bit decoder circuit in accordance with the number of bits of binary inputs BIN. Furthermore, by measuring the output delay times of the primitive circuits that are the base circuits and the 1-bit decoder circuit in advance, the output delay time of the n-bit decoder circuit can easily be calculated in accordance with the number of bits of the binary inputs BIN. Thus, the n-bit decoder circuit can extremely easily be designed, and the design can be changed in short time even when the number of bits of the binary inputs BIN is changed.

While the invention is described above in detail, the invention is not limited to the above embodiments, and various improvements and modifications may be made without departing from the spirit and scope of the invention.

What is claimed is:

1. An n-bit decoder circuit that decodes and converts n-bit binary inputs BIN<n−1:0> into $2^n$-bit thermometer outputs THM(n)<$2^n$−1:0>, where n is an integer of 2 or more, the n-bit decoder circuit comprising:

$2^n$ base circuits each outputting, as an output signal OA, '0', '1' or an input signal IA depending on setting of selection signals S<1:0>; and an (n−1)-bit decoder circuit, wherein '0' and the binary input BIN<n−1> are linked together and input as selection signals S<1:0> for higher $2^{(n-1)}$ base circuits corresponding to the thermometer outputs THM(n)<$2^n$−1:$2^{(n-1)}$>, and each bit of thermometer outputs THM(n−1)<$2^{(n-1)}$−1:0> output from the (n−1)-bit decoder circuit is input as an input signal IA for the higher $2^{(n-1)}$ base circuits, wherein the higher $2^{(n-1)}$ base circuits output '0' to all bits in cases of the binary input BIN<n−1>='0' and output the thermometer outputs THM(n−1)<$2^{(n-1)}$−1:0> in cases of the binary input BIN<n−1>='1', as the thermometer outputs THM(n)<$2^n$−1:$2^{(n-1)}$>, wherein the binary input BIN<n−1> and '1' are linked together and input as selection signals S<1:0> for lower $2^{(n-1)}$ base circuits corresponding to the thermometer outputs THM(n)<$2^{(n-1)}$-1:0>, and each bit of the thermometer outputs THM(n−1)<$2^{(n-1)}$-1:0> is input as an input signal IA for the lower $2^{(n-1)}$ base circuits, wherein the lower $2^{(n-1)}$ base circuits output the thermometer outputs THM(n−1)<$2^{(n-1)}$-1:0> in cases of the binary input BIN<n−1>='0' and output '1' to all bits in cases of the binary input BIN<n−1>='1', as the thermometer outputs THM(n)<$2^{(n-1)}$-1:0>, wherein in cases of n≥3, the (n−1)-bit decoder circuit includes an (m−1)-bit decoder circuit with m being set with a value from n to 3, and in cases of n=2, the (n−1)-bit decoder circuit includes a 1-bit decoder circuit, where m is an integer of n≥m≥3, wherein with m being set with a value from n to 3, the (m−1)-bit decoder circuit includes $2^{(m-1)}$ base circuits and an (m−2)-bit decoder circuit, and wherein the 1-bit decoder circuit outputs '00' in cases of the binary input BIN<0>='0' and outputs '01' in cases of the binary input BIN<0>='1' as thermometer outputs THM(1)<1:0>.

2. The decoder circuit according to claim 1, wherein the base circuit includes a first inverter, a second inverter and an output selection circuit, wherein the first inverter includes a first P type MOS transistor and a first N type MOS transistor, the input signal IA is input to a gate of the first P type MOS transistor and a gate of the first N type MOS transistor, and a drain of the first P type MOS transistor and a drain of the first N type MOS transistor are connected to an internal node, wherein the output selection circuit includes a second P type MOS transistor, a third P type MOS transistor, a second N type MOS transistor and a third N type MOS transistor, the second P type MOS transistor is connected between a power source and a source of the first P type MOS transistor, the third P type MOS transistor is connected between the power source and the internal node, the second N type MOS transistor is connected between a source of the first N type MOS transistor and a ground, the third N type MOS transistor is connected between the internal node and the ground, the selection signal S<1> is input to a gate of the second P type MOS transistor and a gate of the third N type MOS transistor, and the selection signal S<0> is input to a gate of the second N type MOS transistor and a gate of the third P type MOS transistor, and wherein an input terminal of the second inverter is connected to the internal node, and the output signal OA is output from the second inverter.

3. The decoder circuit according to claim 1, wherein the 1-bit decoder circuit includes a single base circuit that receives '01' as the selection signals S<1:0> and outputs the binary input BIN <0> as the output signal OA, and the 1-bit decoder circuit outputs:

'0' as the thermometer output THM(1)<1>; and the binary input BIN<0> as the thermometer output THM(1)<0> from the single base circuit.

4. The decoder circuit according to claim 2, wherein the 1-bit decoder circuit includes a single base circuit that receives '01' as the selection signals S<1:0> and outputs the binary input BIN <0> as the output signal OA, and the 1-bit decoder circuit outputs:

'0' as the thermometer output THM(1)<1>; and the binary input BIN<0> as the thermometer output THM(1)<0> from the single base circuit.

5. The decoder circuit according to claim 1, wherein the 1-bit decoder circuit includes a buffer that outputs the binary input BIN <0>, and the 1-bit decoder circuit outputs:

'0' as the thermometer output THM(1)<1>; and the binary input BIN<0> as the thermometer output THM(1)<0> from the buffer.

6. The decoder circuit according to claim 2, wherein the 1-bit decoder circuit includes a buffer that outputs the binary input BIN <0>, and the 1-bit decoder circuit outputs:

'0' as the thermometer output THM(1)<1>; and the binary input BIN<0> as the thermometer output THM(1)<0> from the buffer.

7. A method of designing an n-bit decoder circuit that decodes and converts n-bit binary inputs BIN<n−1:0> into $2^n$-bit thermometer outputs THM(n)<$2^n$-1:0>, where n is an integer of 2 or more, the method comprising:

a step of designing a base circuit that outputs, as an output signal OA, '0', '1' or an input signal IA depending on setting of selection signals S<1:0>;

a step of designing a 1-bit decoder circuit that outputs '00' in cases of the binary input BIN<0>='0' and outputs '01' in cases of the binary input BIN<0>='1' as thermometer outputs THM(1)<1:0>;

a step of, in cases of n≥3, with m being set with a value from 3 to n, designing an (m−1)-bit decoder circuit using $2^{(m-1)}$ base circuits and an (m−2)-bit decoder circuit, where m is an integer of n≥m≥3; and a step of designing an n-bit decoder circuit using $2^n$ base circuits and an (n−1)-bit decoder circuit, wherein the step of designing the n-bit decoder circuit includes:

a step of linking '0' and the binary input BIN<n−1> together and inputting them as selection signals S<1:0> for higher $2^{(n-1)}$ base circuits corresponding to the thermometer outputs THM(n)<$2^n$-1:$22^{(n-1)}$>, and inputting each bit of thermometer outputs THM(n−1)<$2^{(n-1)}$-1:0> output from the (n−1)-bit decoder circuit as an input signal IA for the higher $2^{(n-1)}$ base circuits; and a step of linking the binary input BIN<n−1> and '1' together and inputting them as selection signals S<1:0> for lower $2^{(n-1)}$ base circuits corresponding to the thermometer outputs THM(n)<$2^{(n-1)}$-1:0>, and inputting each bit of the thermometer outputs THM(n−1)<$2^{(n-1)}$-1:0> as an input signal IA for the lower $2^{(n-1)}$ base circuits, and wherein the step of designing the (m−1)-bit decoder circuit includes:

a step of linking '0' and the binary input BIN<m−2> together and inputting them as selection signals S<1:0> for higher $2^{(m-2)}$ base circuits corresponding to the thermometer outputs THM(m−1)<$2^{(m-1)}$-1:$22^{(m-2)}$>, and inputting each bit of thermometer outputs THM (m−2)<$2^{(m-2)}$-1:0> output from the (m−2)-bit decoder circuit as an input signal IA for the higher $2^{(m-2)}$ base circuits; and a step of linking the binary input BIN<m−2> and '1' together and inputting them as selection signals S<1:0> for lower $2^{(m-2)}$ base circuits corresponding to the thermometer outputs THM(m−1)<$2^{(m-2)}$-1:0>, and inputting each bit of the thermometer outputs THM(m−2)<$2^{(m-2)}$-1:0> as an input signal IA for the lower $2^{(m-2)}$ base circuits.

\* \* \* \* \*